United States Patent
Eberler et al.

(10) Patent No.: US 9,007,062 B2
(45) Date of Patent: Apr. 14, 2015

(54) STANDING WAVE TRAP

(75) Inventors: Ludwig Eberler, Neumarkt i.d. OPf. (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 814 days.

(21) Appl. No.: 13/098,117

(22) Filed: Apr. 29, 2011

(65) Prior Publication Data

US 2011/0267051 A1 Nov. 3, 2011

(30) Foreign Application Priority Data

Apr. 30, 2010 (DE) .................. 10 2010 018 856

(51) Int. Cl.
  *G01R 33/20* (2006.01)
  *G01R 33/36* (2006.01)
  *H03H 1/00* (2006.01)

(52) U.S. Cl.
  CPC .......... *G01R 33/3685* (2013.01); *H03H 1/0007* (2013.01)

(58) Field of Classification Search
  CPC .................... G01R 33/3685; H03H 1/0007
  USPC ............ 324/307, 309, 318, 322; 333/12, 181, 333/185
  See application file for complete search history.

(56) References Cited

U.S. PATENT DOCUMENTS

| | | | | |
|---|---|---|---|---|
| 4,922,204 A | * | 5/1990 | Duerr et al. | 324/322 |
| 5,477,147 A | * | 12/1995 | Friedrich et al. | 324/322 |
| 6,008,649 A | * | 12/1999 | Boskamp et al. | 324/318 |
| 6,202,740 B1 | * | 3/2001 | Brucher et al. | 165/158 |
| 6,593,744 B2 | * | 7/2003 | Burl et al. | 324/322 |
| 6,703,910 B1 | * | 3/2004 | Lapushin | 333/181 |
| 7,233,148 B2 | * | 6/2007 | Hergt et al. | 324/322 |
| 8,207,737 B2 | * | 6/2012 | Greim | 324/322 |
| 2003/0001572 A1 | * | 1/2003 | Leussler | 324/318 |
| 2003/0173099 A1 | * | 9/2003 | Reykowski | 174/35 R |
| 2005/0231300 A1 | * | 10/2005 | Greim et al. | 333/24 C |
| 2007/0026733 A1 | * | 2/2007 | Greim et al. | 439/581 |
| 2009/0085430 A1 | * | 4/2009 | Andle et al. | 310/313 D |
| 2010/0148775 A1 | * | 6/2010 | Greim | 324/309 |

FOREIGN PATENT DOCUMENTS

DE  103 14 215 B4  11/2006

\* cited by examiner

*Primary Examiner* — Melissa Koval
*Assistant Examiner* — Rishi Patel
(74) *Attorney, Agent, or Firm* — Lempia Summerfield Katz LLC

(57) ABSTRACT

The present embodiments relate to a standing wave trap for a magnetic resonance tomography device. The standing wave trap includes a conductor region extending in one plane and at least one capacitor that is conductively connected to two sections of the conductor region.

21 Claims, 3 Drawing Sheets

STANDING WAVE TRAP

This application claims the benefit of DE 10 2010 018 856.5, filed Apr. 30, 2010.

BACKGROUND

The present embodiments relate to standing wave traps.

Magnetic resonance devices for examining objects or patients using magnetic resonance tomography (MR) are known from DE10314215B4, for example.

Running wiring or cables in the vicinity of transmit antennas of an MR system causes standing waves to be stimulated. The standing waves may also propagate on an outer conductor of coaxial cables. A known method for suppressing standing waves is the use of chokes on ferrite cores. This method may be used, for example, in the case of switched-mode power supplies, since the sources of interference extend over a broad frequency spectrum.

Ferrite cores are problematic in the vicinity of antennas and, for example, in the case of transmit antennas in MR systems.

If the standing waves are not suppressed, the following problems may occur:
coupling-in of sources of interference or destruction of connected electronic components;
increased power requirement for the transmit antenna, since part of the transmit power drains away as the standing wave; and
the standing wave may lead to local field enhancements.

Standing wave filters or traps may be fitted closely to the "source of interference." If standing wave traps are used for MR transmit antennas, the following known solutions exist in the prior art by reason of the constraints (e.g., static magnetic field, small space requirement, dielectric strength):

1. A "balun" according to FIG. 2: A cylindrical (or also cuboidal or hexagonal) conductive structure is pushed over the cable and connected at one end to the outer conductor of the cable. Given a length L of the balun, this arrangement acts as a standing wave trap at the frequency $F=c/(4*L)$, where c is the propagation speed in the medium between the cable and the balun. If the blocking effect is to be realized at a different frequency, this may be achieved by adding capacitors.

2. "Wound standing wave trap" according to FIG. 3: The cable is wound to form a coil, and a capacitor is arranged in parallel with the coil. In this way, a parallel resonant circuit is formed. The parallel resonant circuit exhibits a high impedance at the resonant frequency of the parallel resonant circuit and consequently, suppresses the propagation of standing waves.

SUMMARY AND DESCRIPTION

The present embodiments may obviate one or more of the drawbacks or limitations in the related art. For example, he efficiency of imaging MRT systems may be optimized.

A standing wave trap according to the present embodiments may have the following advantages:
A flat implementation is possible, thus resulting in no additional space requirement.
The standing wave trap may be integrated, for example, in a ground plane of a printed circuit board, so in that respect, no additional component is used.
The standing wave trap may be built as double-resonant or as multi-resonant (e.g., blocking for two or more frequencies), for example, in the form of a common solution for devices with 1.5T and 3T and/or for covering spectroscopic frequencies.

The standing wave trap may be tuned in the absence of a connecting cable (e.g., to at least one frequency to be blocked), for example, prior to installation.

DETAILED DESCRIPTION OF THE DRAWINGS

Figure 1:
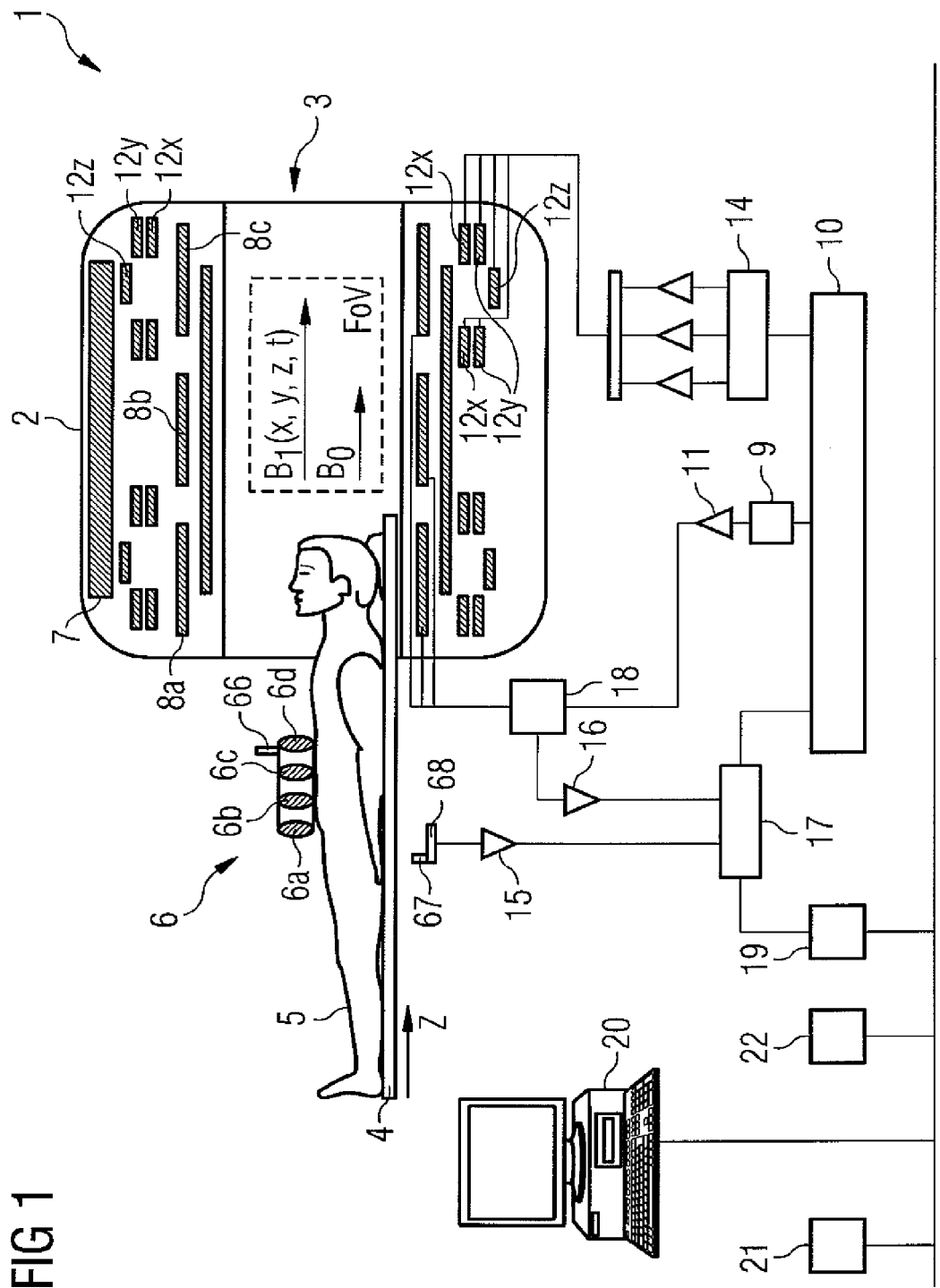
FIG. 1 shows an MRT system.
Figure 2:
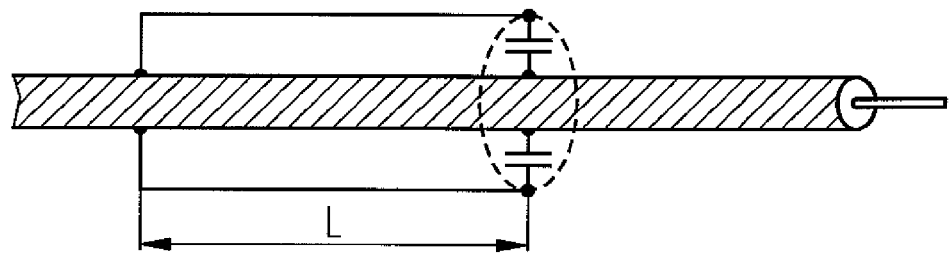
FIGS. 2-3 show standing wave traps.
Figure 3:
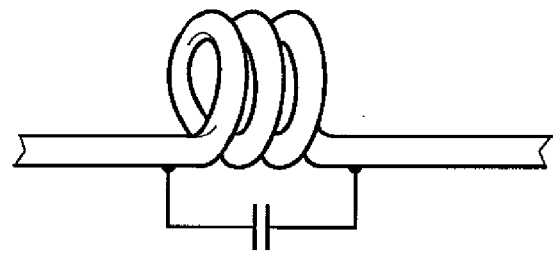

FIG. 1 shows an imaging magnetic resonance device MRT 1 that includes a whole-body coil 2 with, for example, a tubular space 3, into which a patient couch 4 (e.g., a patient bed) supporting a body (e.g., a body of a patient 5) may be moved in the direction of the arrow z in order to generate images of the patient 5. In the embodiment shown in FIG. 1, a local coil positioning arrangement 6 is placed on the patient 5. Using the local coil positioning arrangement 6, images of a local region (e.g., of the head K) may be acquired when the patient 5 in FIG. 1 is moved in the direction z into the field of view (FoV). Signals of the local coil positioning arrangement 6 may be evaluated (e.g., converted into images and stored or displayed) by an evaluation device (e.g., elements 67, 66, 15, 17) of the imaging magnetic resonance device MRT 1. The evaluation device may be connected to the local coil positioning arrangement 6, for example, via coaxial cable or wirelessly.

In order to examine the body 5 (e.g., an examination subject or the patient) with the imaging magnetic resonance device MRT 1 using magnetic resonance imaging, different magnetic fields that are coordinated with one another with precision in terms of temporal and spatial characteristics are applied to the body 5. A strong magnet (e.g., a cryomagnet 7) in a measurement chamber having, for example, a tunnel-shaped opening 3, generates a strong static main magnetic field $B_0$ in the range from, for example, 0.2 Tesla to 3 Tesla or more. The body 5, which is to be examined, is positioned on the patient couch 4 and is moved into a region of the main magnetic field $B_0$ that is approximately homogeneous in the FoV. The nuclear spins of atomic nuclei of the body 5 are excited via magnetic radio-frequency excitation pulses. The magnetic radio-frequency excitation pulses are emitted via a radio-frequency antenna (e.g., shown in FIG. 1 in simplified form as a body coil 8). In one embodiment, the magnetic radio-frequency excitations pulses are emitted via the local coil positioning arrangement 6. Radio-frequency excitation pulses are generated, for example, by a pulse generation unit 9 that is controlled by a pulse sequence control unit 110. After being amplified by a radio-frequency amplifier 111, the radio-frequency excitation pulses are routed to the radio-frequency antenna 8a, b, c. The radio-frequency system shown in FIG. 1 is indicated only schematically. In other embodiments, more than one pulse generation unit 9, more than one radio-frequency amplifier 111 and a plurality of radio-frequency antennas 8a, b, c are used in the imaging magnetic resonance device MRT 1.

The imaging magnetic resonance device MRT 1 has gradient coils 12x, 12y, 12z, using which magnetic gradient fields are radiated in the course of a measurement in order to produce selective layer excitation and for spatial encoding of the measurement signal. The gradient coils 12x, 12y, 12z are controlled by a gradient coil control unit 14 that, like the pulse generation unit 9, is connected to the pulse sequence control unit 110.

The signals transmitted by the excited nuclear spins are received by the body coil 8a, 8b, 8c and/or at least one local coil positioning arrangement 6, amplified by associated radio-frequency preamplifiers 16, and processed further and digitized by a receiving unit 17. The recorded measured data is digitized and stored in the form of complex numeric values in a k-space matrix. An associated MR image may be reconstructed using a multidimensional Fourier transform from the k-space matrix populated with values.

In the case of a coil that may be operated both in transmit and in receive mode (e.g., the body coil 8a, b, c), correct signal forwarding is controlled using an upstream duplexer 18.

From the measured data, an image processing unit 19 generates an image that is displayed to a user via an operator console 20 and/or stored in a memory unit 21. A central computer unit 22 controls the individual system components.

In MR tomography, images having a high signal-to-noise ratio (SNR) may be recorded using local coil arrangements (e.g., coils, local coils). The local coil arrangements may be antenna systems that are placed in the immediate vicinity on (anterior), under (posterior) or in the body 5. In the course of an MR measurement, the excited nuclei induce a voltage in the individual antennas of the local coil. The induced voltage is amplified by a low-noise preamplifier (e.g., a low-noise amplifier (LNA), a preamp) and is forwarded to the receive electronics. High-field systems (e.g., 1.5T and more) are also used in the case of high-resolution images in order to improve the signal-to-noise ratio. Since more individual antennas may be connected to an MR receiving system than there are receivers present, a switching array (e.g., RCCS) is installed between receive antennas and receivers. The switching array routes the currently active receive channels (e.g., the receive channels lying in the FoV of the magnet) to the receivers present. This enables more coil elements to be connected than there are receivers present, since in the case of whole-body coverage, only coils that are disposed in the FoV or in the homogeneity volume of the magnet may be read out.

In one embodiment, the antenna system may include, for example, one antenna element or of a plurality of antenna elements (e.g., coil elements) in the form of an array coil that may be used as the local coil positioning arrangement 6. The individual antenna elements are implemented, for example, as loop antennas (loops), butterfly coils, or saddle coils. The local coil positioning arrangement 6 includes, for example, coil elements, a preamplifier, further electronics (e.g., standing wave traps), a housing, supports, and a cable with a plug, using which the local coil positioning arrangement 6 is connected to the imaging magnetic resonance device MRT 1, or combinations thereof. A receiver 68 mounted on the system side filters and digitizes a signal received, for example, wirelessly by the local coil 6 and passes the data to a digital signal processing entity that mostly derives an image or a spectrum from the data acquired by a measurement. The digital signal processing entity makes the image or the spectrum available to a user for subsequent diagnosis by the user or for storage in a memory, for example.

Standing wave traps according to the present embodiments are shown in FIGS. 4-7.

Figure 4:
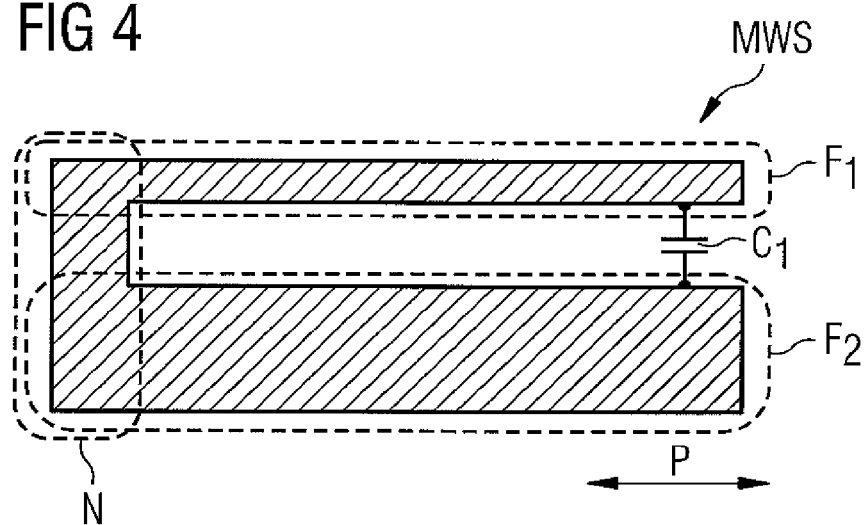
FIGS. 4-7 show exemplary embodiments of standing wave traps.

According to FIG. 4, a standing wave trap MWS of the present embodiments may be formed, for example, from a "U-shaped," flat conductor (N, F1, F2) (e.g., a conductor region) and at least one capacitor C. The standing wave trap MWS shown in FIG. 4 includes a planar copper area (N, F1, F2).

The at least one capacitor C is used for frequency tuning. A fine-tuning of the frequency (which a standing wave trap blocks) may be accomplished alternatively or in addition by way of a shifting of the installation position of the capacitor or of the standing wave trap. Frequency tuning may be carried out, for example, by shifting the installation position of the at least one capacitor C between subsections F1, F2 of the standing wave trap MWS in the direction of the double arrow P.

Figure 6:
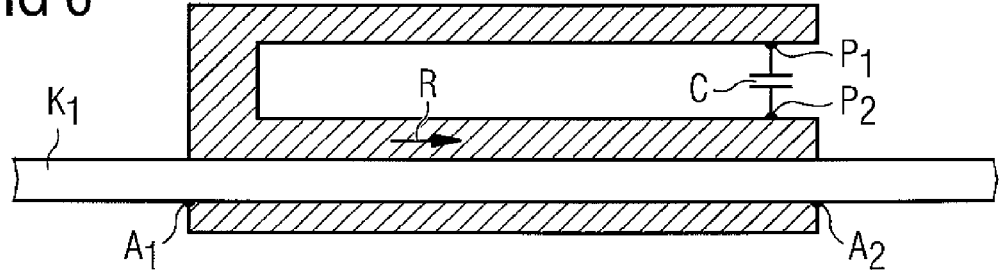

In a standing wave trap according to FIG. 4 and FIG. 6, the conductor region has a layout that includes a transverse section N extending vertically with respect to a current-conducting direction R of the conductor region defined between at least two terminals A1, A2 on the standing wave trap MWS. The conductor region also includes two longitudinal sections F1, F2. In one embodiment, each of the two longitudinal sections F1, F2 extends parallel to the current-conducting direction R of the conductor region defined between the at least two terminals A1, A2 on the standing wave trap, the at lease one capacitor C (or a plurality of capacitors) being disposed between the two longitudinal sections F1, F2.

Figure 5:
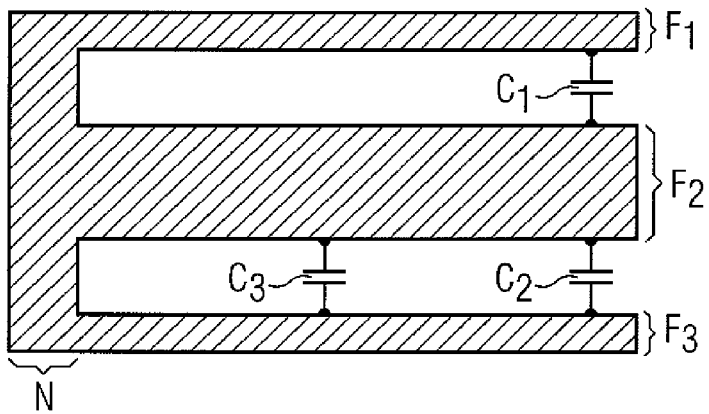

According to FIG. 5, a standing wave trap MWS of the present embodiments may include, for example, a flat conductor that is "E-shaped" in a plan view and at least two capacitors C1, C2. In one embodiment, the standing wave trap MWS may be planar. The standing wave trap MWS may have a symmetrical design.

For a double-resonant embodiment (e.g., blocks on two frequencies), the at least two capacitors C1, C2 may be different.

For a multi-resonant embodiment that blocks more than two frequencies, the two or more capacitors C1, C2, C3 may be different. A plurality of capacitors C2, C3 of the two or more capacitors C1, C2, C3 may also be arranged between the same parts (e.g., longitudinal sections F2, F3) of the standing wave trap.

In a standing wave trap according to FIG. 4 and FIG. 5, the conductor region has a cross-section that includes a transverse section N extending (at least also) vertically with respect to the current-conducting direction R of the conductor region defined between at least two terminals on (lateral edges of) the standing wave trap. The standing wave trap shown in FIG. 5 includes at least three longitudinal sections F1, F2, F3. Each longitudinal section of the at least three longitudinal sections F1, F2, F3 extends parallel to the current-conducting direction R of the conductor region defined between the at least two terminals on the standing wave trap. One capacitor C1 of at least two capacitors C1, C2 is disposed between a first longitudinal section F1 and a second longitudinal section F2 of the at least three longitudinal sections F1, F2, F3. Another capacitor C2 is disposed between the second longitudinal section F2 and a third longitudinal section F3 of the at least three longitudinal sections F1, F2, F3.

The conductor region N+F1+F2, N+F1+F2+F3 of the standing wave trap MWS extends in two directions of a plane, the two directions being orthogonal to each other. The plane, in a section through the conductor region, may transect all parts N+F1+F2, N+F1+F2+F3 of the conductor region.

FIG. 6 shows a connection of two cable sections of a cable K1, which is to be attenuated using at least one standing wave trap MWS, to the standing wave trap MWS at two points A1, A2.

In FIG. 6, the cable K1, which is to be attenuated, is a continuous cable, to which a standing wave trap is fixed at the at least two points A1, A2. The standing wave trap MWS may be balanced independently. The cable K1 is attached, for example, after the standing wave trap has been aligned to the standing wave trap MWS. In one embodiment, the cable K1 is soldered to the standing wave trap MWS (externally) at the at least two points A1, A2, as shown in FIG. 6.

Figure 7:
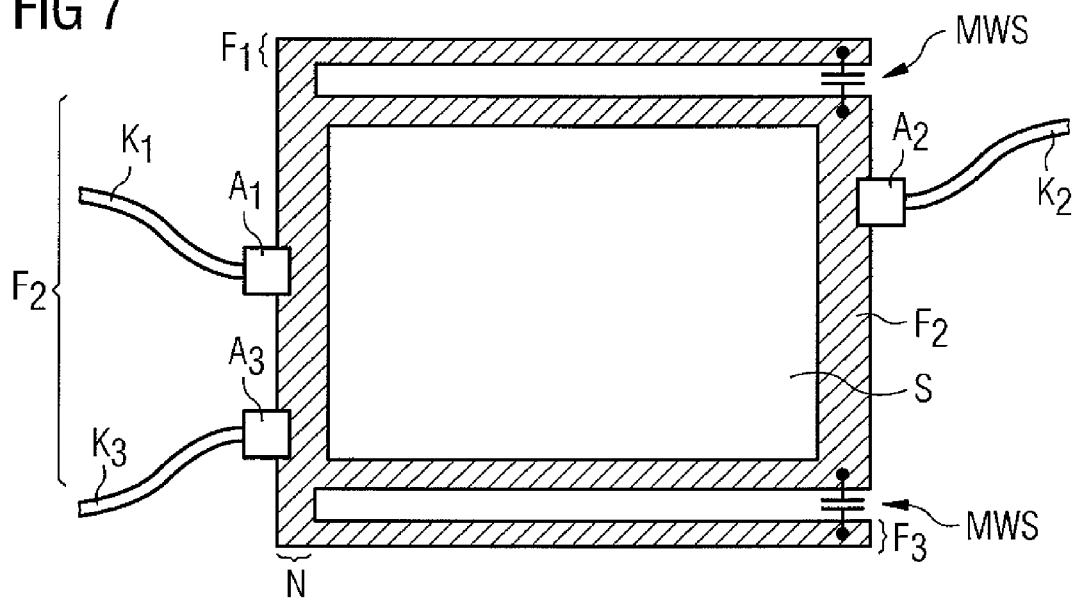

As FIG. 7 shows, a conductor structure of a standing wave trap MWS of the present embodiments may be part of a printed circuit board.

As FIG. 7 shows, a cable K1, K2 may also be soldered to the standing wave trap MWS, for example, at three or more points A1, A2, A3 (e.g., contacts).

In FIG. 7, the standing wave trap is integrated into a ground plane of the printed circuit board. The ground plane of the printed circuit board forms areas F1, F2, F3 of the standing wave trap MWS.

FIG. 7 also shows that a circuit S, indicated schematically as area S in FIG. 7, may be arranged on a flat (e.g., planar) subsection F2 of the standing wave trap MWS.

For example, the contacts A1, A2, A3 for cables K1, K2, K3 may be arranged on one side (e.g., underside or ground plane) of the standing wave trap MWS. The circuit S may be arranged, for example, on a side (e.g., top side) of the standing wave trap that is disposed opposite the one side.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A standing wave trap for a magnetic resonance tomography device, the standing wave trap comprising:
   a conductor region extending in one plane; and
   a capacitor that is conductively connected to two sections of the single conductor region,
   wherein the conductor region runs in a flat plane, through which a current-conducting direction runs between at least two terminals on the standing wave trap.

2. The standing wave trap as claimed in claim 1, wherein the conductor region has a U-shaped cross-section.

3. The standing wave trap as claimed in claim 1, wherein the conductor region comprises:
   a transverse section that extends vertically with respect to the current-conducting direction; and
   two longitudinal sections, each of the two longitudinal sections extending parallel to the current-conducting direction,
   wherein the capacitor is disposed between the two longitudinal sections.

4. The standing wave trap as claimed in claim 1, wherein the conductor region has an E-shaped cross-section.

5. The standing wave trap as claimed in claim 1, wherein the conductor region has a cross-section comprising:
   a transverse section that extends vertically with respect to the current-conducting direction; and
   at least three longitudinal sections, each of the at least three longitudinal sections extending parallel to the current-conducting direction,
   wherein the capacitor is a first capacitor and the standing wave trap further comprises a second capacitor, or the capacitor is the second capacitor and the standing wave trap further comprises the first capacitor, and
   wherein the first capacitor is disposed between two longitudinal sections of the conductor region, and the second capacitor is disposed between two longitudinal sections of the conductor region, of which at least one longitudinal section is a different longitudinal section from the two longitudinal sections of the conductor region, between which the first capacitor is disposed.

6. The standing wave trap as claimed in claim 1, wherein the conductor region has a cross-section comprising three longitudinal sections, each of the three longitudinal sections extending parallel to the current-conducting direction, and
   wherein a middle section of the three longitudinal sections of the conductor region has a greater surface area than longitudinal sections of the three longitudinal sections that are adjacent to the middle section.

7. The standing wave trap as claimed in claim 6, wherein a circuit is arranged on the middle section of the three longitudinal sections of the conductor region.

8. The standing wave trap as claimed in claim 5, wherein the conductor region is completely flat in the transverse section and in the at least three longitudinal sections.

9. The standing wave trap as claimed in claim 1, wherein the conductor region runs evenly in the flat plane.

10. The standing wave trap as claimed in claim 5, wherein only one longitudinal section of the at least three longitudinal sections of the conductor region runs evenly in the flat plane.

11. The standing wave trap as claimed in claim 1, wherein the conductor region extends in the flat plane in the direction of two straight lines that are orthogonal to each other.

12. The standing wave trap as claimed in claim 1, wherein some or all sections of the conductor region are manufactured from one piece.

13. The standing wave trap as claimed in claim 1, wherein the conductor region is part of a printed circuit board.

14. The standing wave trap as claimed in claim 1, wherein the capacitor is one capacitor of a plurality of capacitors, and
   wherein each capacitor of the plurality of capacitors blocks a different frequency.

15. The standing wave trap as claimed in claim 1, wherein the conductor region is made of a conducting material.

16. A magnetic resonance tomography device comprising:
   a standing wave trap comprising:
      a conductor region extending in one plane; and
      a capacitor that is conductively connected to two sections of the single conductor region,
      wherein the conductor region runs in flat plane, through which a current-conducting direction runs between at least two terminals on the standing wave trap.

17. The standing wave trap as claimed in claim 1, wherein the conductor region has a cross-section comprising:
   a transverse section that extends vertically with respect to the current-conducting direction; and
   three longitudinal sections comprising a first longitudinal section, a second longitudinal section, and a third longitudinal section, each of the three longitudinal sections extending parallel to the current-conducting direction,
   wherein the capacitor is a first capacitor and the standing wave trap further comprises a second capacitor, or the capacitor is the second capacitor and the standing wave trap further comprises the first capacitor, and
   wherein the first capacitor is disposed between the first longitudinal section and the second longitudinal section, and the second capacitor is disposed between the second longitudinal section and the third longitudinal section.

18. The standing wave trap as claimed in claim 13, wherein the conductor region is part of a ground plane of a printed circuit board.

19. The standing wave trap as claimed in claim 15, wherein the conductor region is made of copper.

20. A standing wave trap for a magnetic resonance tomography device, the standing wave trap comprising:
- a conductor region, a cross section of the conductor region comprising a transverse section and two longitudinal sections; and
- a capacitor that is conductively connected to the two longitudinal sections,
- wherein the transverse section extends between the two longitudinal sections and is transverse with respect to a direction in which the two longitudinal sections extend, and
- wherein a cable abutting the standing wave trap extends in a direction parallel to the direction in which the two longitudinal sections extend, and
- wherein the conductor region runs in a flat plane, through which a current-conducting direction runs between at least two terminals on the standing wave trap.

21. A standing wave trap for a magnetic resonance tomography device, the standing wave trap comprising:
- a conductor region, a cross section of the conductor region comprising a transverse section and two longitudinal sections, wherein the transverse section extends between the two longitudinal sections and is transverse with respect to a direction in which the two longitudinal sections extend; and
- a capacitor that is conductively connected to the two longitudinal sections,
- wherein a first cable and a second cable are connected to different sides of the standing wave trap, respectively, and
- wherein the conductor region runs in a flat plane, through which a current-conducting direction runs between at least two terminals on the standing wave trap.

\* \* \* \* \*